(12) United States Patent
Boring

(10) Patent No.: US 12,707,592 B1
(45) Date of Patent: Aug. 11, 2026

(54) CASUALTY-RESISTANT ENCLOSURE FOR A MICRO DATA CENTER

(71) Applicant: Keo Civil, LLC, Cody, WY (US)

(72) Inventor: Gary A. Boring, Cody, WY (US)

(73) Assignee: Keo Civil, LLC, Cody, WY (US)

(*) Notice: Subject to any disclaimer, the term of this patent is extended or adjusted under 35 U.S.C. 154(b) by 0 days.

(21) Appl. No.: 19/263,106

(22) Filed: Jul. 8, 2025

(51) Int. Cl.
*H05K 7/14* (2006.01)
*F41H 5/24* (2006.01)
*H05K 7/20* (2006.01)

(52) U.S. Cl.
CPC ............. *H05K 7/1495* (2013.01); *F41H 5/24* (2013.01); *H05K 7/20145* (2013.01); *H05K 7/20181* (2013.01); *H05K 7/20718* (2013.01)

(58) Field of Classification Search
CPC combination set(s) only.
See application file for complete search history.

(56) References Cited

U.S. PATENT DOCUMENTS 7,429,139 B2 9/2008 Wesselink
7,448,169 B2 * 11/2008 Maliszewski ............. E04H 9/10 52/301
8,029,154 B2 10/2011 Myer
8,289,694 B2 * 10/2012 Winokur ................ G11B 33/14 250/504 R
8,669,881 B2 * 3/2014 Chang ..................... G06F 1/263 33/1 HH
8,938,923 B2 1/2015 Nyce
9,482,494 B1 * 11/2016 Lombardo ................ F41H 5/24
9,696,121 B1 * 7/2017 Perley ..................... F41H 5/023
9,814,160 B2 * 11/2017 Slessman ............... H05K 7/202
9,837,698 B2 12/2017 Lasier
9,854,700 B2 * 12/2017 Moore ............... G11B 33/1406
10,629,980 B2 4/2020 Schwengler
10,663,128 B2 5/2020 Abbott
10,853,460 B2 * 12/2020 Crawford ................ G06F 21/86
10,853,752 B2 12/2020 Bayges
10,947,751 B2 3/2021 Lockwood
11,489,484 B2 11/2022 Chentnik
(Continued)

FOREIGN PATENT DOCUMENTS

CN 102334233 B 7/2014
CN 213927773 U 8/2021
(Continued)

*Primary Examiner* — Lisa Lea-Edmonds
(74) *Attorney, Agent, or Firm* — Neustel Law Offices

(57) ABSTRACT

An enclosure for micro data center equipment includes an interior chamber, an exterior housing, an air intake pipe, and a void. The interior chamber houses heat-generating micro data center equipment. The exterior housing substantially surrounds the interior chamber and is fabricated from a material that is both casualty-resistant and resistant to hostile environments. The air intake pipe is coupled between an opening in the interior chamber and an opening in the exterior housing. The air intake pipe receives outdoor air from a location external to the exterior housing at the opening in the exterior housing and delivers the outdoor air to the interior chamber at the opening in the interior chamber; the outdoor air delivered to the interior chamber serves to cool the heat-generating micro data center equipment. The void is intermediate the interior chamber and the exterior housing and receives a weight-enhancing material.

20 Claims, 16 Drawing Sheets

(56) References Cited

U.S. PATENT DOCUMENTS

| | | | | |
|---|---|---|---|---|
| 11,665,861 | B2 * | 5/2023 | Bailey | H05K 7/20736 454/184 |
| 12,356,579 | B1 * | 7/2025 | Welsko | H05K 7/2029 |
| 2007/0289250 | A1 * | 12/2007 | Maliszewski | E04H 9/14 52/745.04 |
| 2009/0050365 | A1 * | 2/2009 | Moore | H05K 5/021 174/547 |
| 2009/0219679 | A1 * | 9/2009 | Moore | G06F 1/20 312/213 |
| 2011/0303676 | A1 * | 12/2011 | Day | B65D 81/02 220/560.01 |
| 2012/0087085 | A1 * | 4/2012 | Moore | H05K 7/1495 361/679.46 |
| 2012/0160719 | A1 * | 6/2012 | Chang | G06F 1/263 206/320 |
| 2013/0036678 | A1 | 2/2013 | Nyce | |
| 2013/0240220 | A1 * | 9/2013 | Loureiro | B65D 43/22 169/45 |
| 2015/0021990 | A1 | 1/2015 | Myer | |
| 2015/0239632 | A1 * | 8/2015 | Loureiro | H05K 5/0213 169/45 |
| 2016/0122110 | A1 * | 5/2016 | Day | B65D 81/02 220/560.01 |
| 2016/0324036 | A1 * | 11/2016 | Slessman | H05K 7/20609 |
| 2017/0176148 | A1 * | 6/2017 | Perley | G06F 1/182 |
| 2017/0279187 | A1 | 9/2017 | Lockwood | |
| 2019/0174651 | A1 * | 6/2019 | Crawford | H05K 7/1497 |
| 2021/0042400 | A1 * | 2/2021 | Crawford | H05K 7/18 |
| 2024/0110402 | A1 | 4/2024 | Ducros | |

FOREIGN PATENT DOCUMENTS

| | | | |
|---|---|---|---|
| CN | 221761559 | U | 9/2024 |
| KR | 102654499 | B1 | 4/2024 |
| WO | 2018132463 | A1 | 7/2018 |
| WO | 2024213978 | A1 | 10/2024 |

* cited by examiner 64
12
22
70
26
66
24
22
20

22
24
26
22

22
20
24
26
22

22
24
22

22
24
22
22
20

56
54
10
10
56
54
10
52
52
10
10
10

116

114

114

CASUALTY-RESISTANT ENCLOSURE FOR A MICRO DATA CENTER

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND

The described example embodiments in general relate to enclosures and, more particularly, to enclosures that are capable of housing electronic equipment/electrical components, such as those used for data communications and data storage, in hostile environments.

The demand for edge computing (e.g., a distributed computer model where data processing and storage are brought closer to the devices generating the data, rather than relying solely on a centralized cloud) solutions is rapidly increasing due to the rise of IoT (Internet of Things) devices. Low-latency applications are becoming essential, especially for real-time data processing. As such, challenges associated with transmitting large volumes of data to distant centralized data centers necessitate new solutions.

Micro data centers position computing resources closer to the point of data generation. This proximity reduces latency and enhances the speed of data processing and analytics. However, few, if any, currently available micro data centers are available to meet edge computing demands in hostile, potentially dangerous environments due to the nature of the enclosures in which currently available micro data centers reside. Such enclosures are typically thin-walled and lightweight thereby suited only to limited-access, air-conditioned, clean, internal office environments.

SUMMARY

Some of the various embodiments of the present disclosure relate to enclosures that can be used as micro data centers in outdoor environments due to the enclosures being configured and built to withstand, for example, fire, theft, vandalism, and projectiles (e.g., bullets, shells, missiles, rockets, etc.) and environmental hazards such as extreme temperatures, storms, and natural disasters. Some of the various embodiments of the present disclosure include enclosures that are both casualty-resistant and resistant to the effects of hostile environments. In some embodiments, the enclosure includes a steel housing that substantially surrounds a steel interior chamber that is configured to house micro data center equipment (e.g., electronic equipment/electrical components). At least one air intake pipe is coupled between an opening in the steel housing and an opening in the interior chamber to provide outdoor air to the micro data center equipment with the outdoor air serving to cool the micro data center equipment; a vent opening in the interior chamber that extends through the steel housing is preferably provided to allow heat generated by the micro data center equipment to escape. The enclosure additionally includes a void intermediate the interior chamber and the steel housing that receives a weight-enhancing material, serving as a protective weight (e.g., making movement or stealing of the enclosure difficult if not impossible). In other embodiments, the enclosure is additionally equipped with a bullet-proof access panel that is removably secured to the interior chamber and a door that is hingedly secured to the steel housing that is openable to reveal the access panel. In other embodiments, the enclosure includes a stacking feature that enables one enclosure to be stacked atop another enclosure for shipping and/or for active deployment wherein one enclosure is in electrical and/or data communication with another enclosure.

There has thus been outlined, rather broadly, some of the embodiments of the present disclosure in order that the detailed description thereof may be better understood, and in order that the present contribution to the art may be better appreciated. There are additional embodiments that will be described hereinafter and that will form the subject matter of the claims appended hereto. In this respect, before explaining at least one embodiment in detail, it is to be understood that the various embodiments are not limited in its application to the details of construction or to the arrangements of the components set forth in the following description or illustrated in the drawings. Also, it is to be understood that the phraseology and terminology employed herein are for the purpose of the description and should not be regarded as limiting.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evidence to the contrary from the description, where elements in different figures use identical reference numbers, the elements are generally either identical or at least similar in function or purpose.

DETAILED DESCRIPTION

A. Overview

Figure 1:
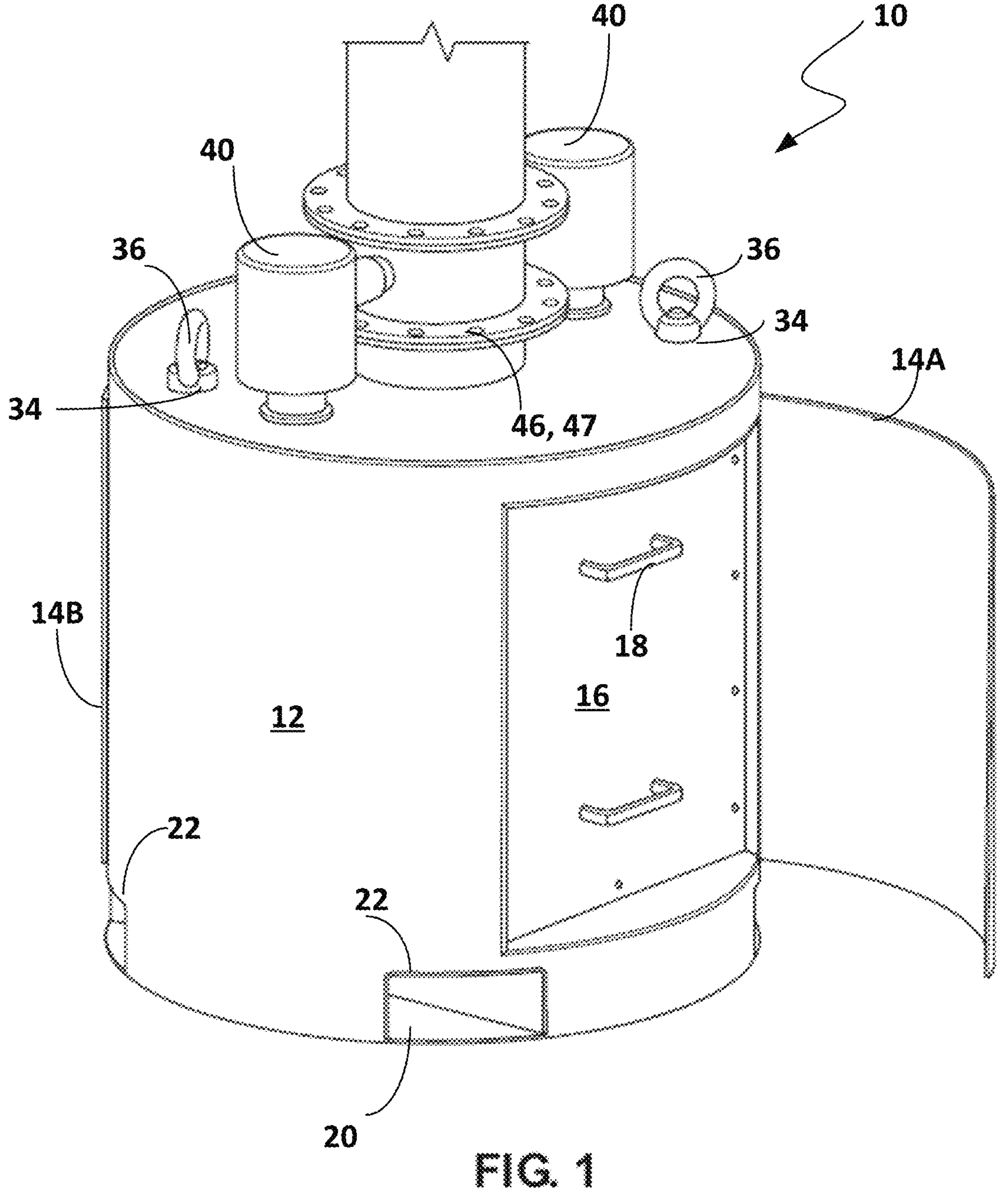
FIG. 1 is a perspective view of an example embodiment of a casualty-resistant enclosure in accordance with an example embodiment.

Some of the various embodiments of the present disclosure relate to a casualty-resistant enclosure that protectively houses and cools heat-generating data communications equipment, data storage equipment, and/or other electronic equipment/electrical components in hostile environments. The hostile environments (i.e., an environment with conditions that pose significant challenges or threats to human survival and well-being and/or extreme or challenging conditions that make it difficult for electronic equipment/electrical components to survive or function properly) include, for example, conflict/war zones, riots, remote/undeveloped areas, disaster relief areas, and public gathering sites that are subject to airborne and/or ground-based ammunition, extreme temperatures, snow/rain, wind, sun, dust/sand, and/or shocks. The casualty-resistant enclosure is of a steel and concrete design providing the enclosure with a construction that is portable, rugged, sturdy, and casualty-resistant (i.e., resistant to being damaged, destroyed, or stolen) such as being resistant to fire, theft, vandalism, and bullets.

The casualty-resistant enclosure is especially suited for use as a micro data center (i.e., a micro data center is a small, self-contained data center designed to house information technology equipment and provide data processing and storage capabilities in a compact space) in a stand-alone, single unit configuration or in a network configuration of micro data centers where a plurality of the casualty-resistant enclosures are in wired/wireless communication and/or electrical communication with one another.

Advantages of the casualty-resistant enclosure include: (a) no excavation or buried utility interference; (b) no excavation permits or locates; (c) easily set up on rock, frozen ground, or permafrost; (d) fire, theft, and bullet resistant; (e) fast and simple field assembly; (f) quickly deployable & redeployable; (g) round and hardened base for debris or bullet deflection; (h) enclosures are stackable for shipping & storing; (i) portable with forklift/crane; (j) hardened for electronics protection; (k) flexible instrumentation and power options; (l) robust and damage resistant; (m) customizable heights-even in remote areas; (n) multiple location manufacturing options that require no special tools or machines; (o) reconfigurable as demands change; and (p) recyclable.

An enclosure 10 for micro data center equipment generally includes an interior chamber 32, an exterior housing 11, an air intake pipe 76, and a void intermediate the interior chamber 32 and exterior housing 11. The interior chamber 32 houses heat-generating micro data center equipment (e.g., heat-generating electronic equipment/electrical components 88). The exterior housing 11 substantially surrounds the interior chamber 32 and is fabricated from a material that is both casualty-resistant and resistant to hostile environments. The air intake pipe 76 is coupled between an opening (e.g., air flow opening 74) in the interior chamber 32 and an opening (e.g. air intake opening 38) in the exterior housing 11. The air intake pipe 76 receives outdoor air from a location external to the exterior housing 11 at the air intake opening 38 in the exterior housing 11 and delivers the outdoor air to the interior chamber 32 at the air flow opening 74 in the interior chamber 32; the outdoor air delivered to the interior chamber 32 serves to cool the heat-generating micro data center equipment. The void intermediate the interior chamber 32 and the exterior housing 11 receives a protective and weight-enhancing material such as concrete 30. A vent opening (e.g., combined vent opening 44 in the top plate 28 of the exterior shell 11 and vent opening 72 in the ceiling plate 68 of the interior chamber 32) enables heat generated by the heat-generating micro data center equipment to escape the interior chamber 32 and the exterior housing 11.

In certain embodiments, the vent opening 44 in the top plate 28 of the exterior housing includes a coupling 46, such as an attachment collar 47. In certain embodiments, the interior chamber 32 and the exterior housing 11 are fabricated from mild steel, which enables the welding of the interior chamber 32 to the exterior housing 11; at least a portion of the mild steel may be coated with a thermal coating. In certain embodiments, the exterior housing 11 is of a circular configuration while the interior chamber 32 is of a square or rectangular configuration.

In certain embodiments, the exterior housing 11 includes forklift tine openings 22 and/or lifting attachments enabling lifting and lowering of the enclosure 10 by a forklift or a load line of a crane, respectively. In certain embodiments, the protective and weight-enhancing material comprises plain concrete while in other embodiments the protective and weight-enhancing material comprises low density cellular concrete (LDCC). Other possible void-filling materials include but are not limited to grouts, epoxies, and/or heavy weight concrete In certain embodiments, the exterior housing 11 includes a stacking feature that enables the enclosure 10 to be stacked atop another enclosure with a stacking feature. In certain embodiments one or both of the noted stacking features includes an opening (e.g., opening 26 in the bottom plate 20 and/or vent opening 44 in the top plate 28) that enables the enclosure 10 to be in electrical and/or data communication, via cabling, with the other enclosure 10. In certain embodiments, the air intake opening 38 in the exterior housing 11 directly interface with an air intake box 40 that includes an air filter 86.

It should be noted that while the casualty-resistant enclosure 10 is particularly suited for hostile environments, the casualty-resistant enclosure 10 can also be used in an enclosed environment where high security is desired.

B. Exterior

Referring to the various Figures, particularly FIGS. 1-9, 16, and 17A-17B, an exterior housing 11 of the casualty-resistant enclosure 10, hereafter, "enclosure" 10, generally comprises an exterior shell 12, a bottom plate 20, and a top plate 28. The exterior shell 12 has one or more hinged doors 14A, 14B that are openable to a respective bullet-proof access panel 16, which can include one or more handles 18. The bottom plate 20 is preferably fixedly securable to a first end of the exterior shell 12 and is preferably provided with forklift tine openings 22. In certain embodiments, the bottom plate 20 is securable to a support pad, such as the concrete support pad 23 illustrated in FIG. 16, and/or directly securable to the ground with one or more anchors 25 (e.g., helical anchors, concrete anchors, earth anchors, etc.).

Figure 2:
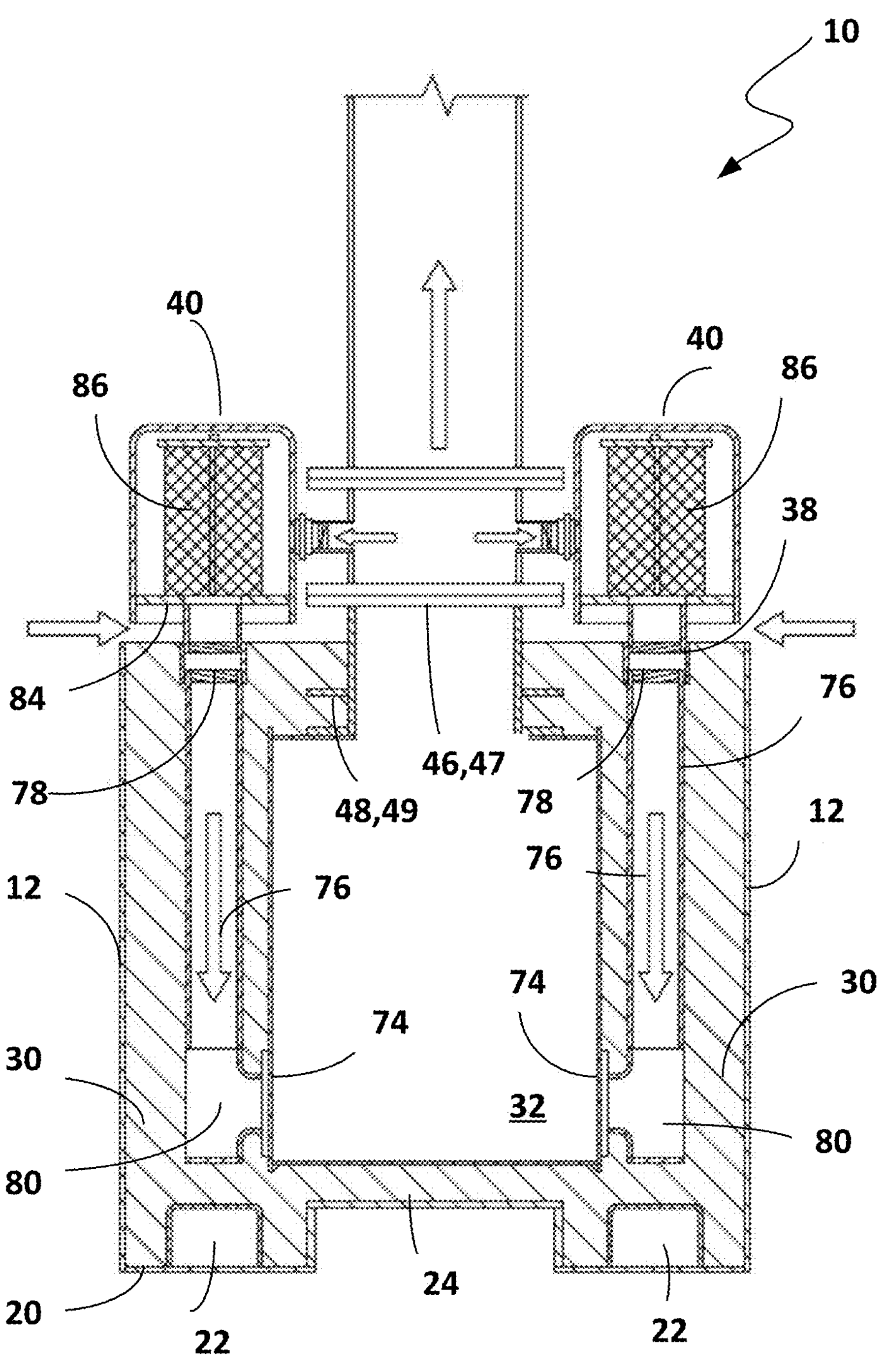
FIG. 2 is a cross-sectional view of the casualty-resistant enclosure of FIG. 1.
Figure 4:
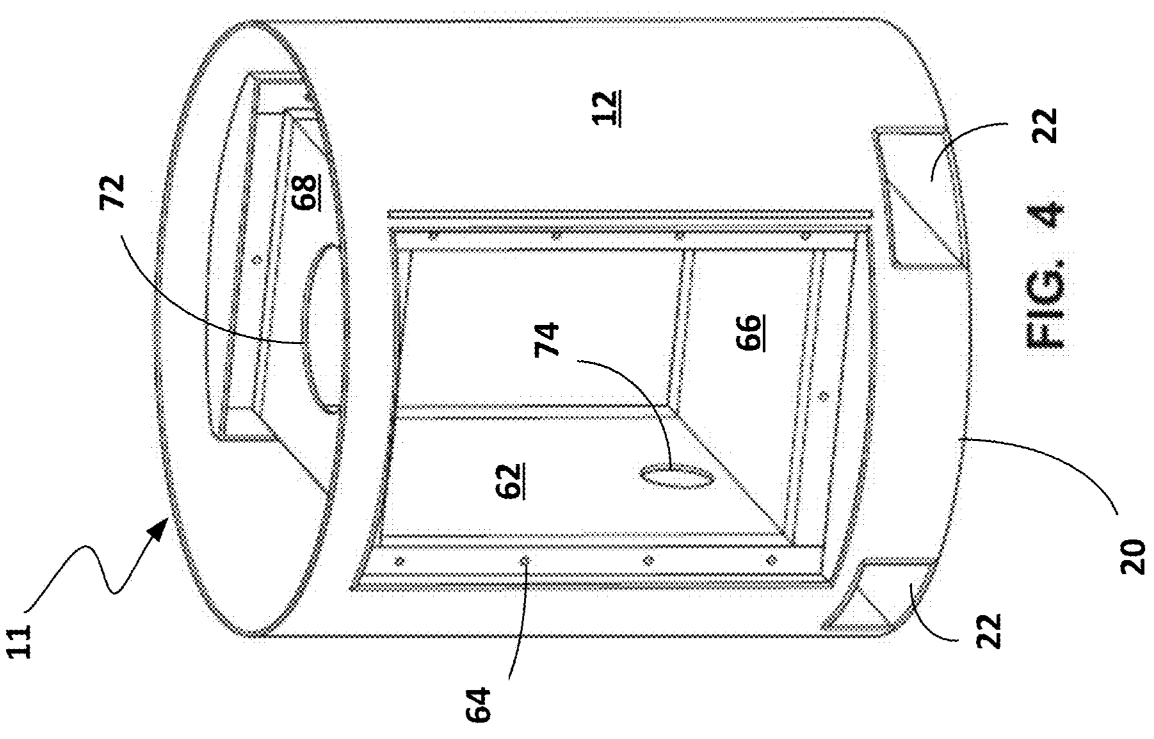
FIG. 4 is a perspective view of the exterior housing of the casualty-resistant enclosure of FIG. 1 with top lid and concrete removed.
Figure 3:
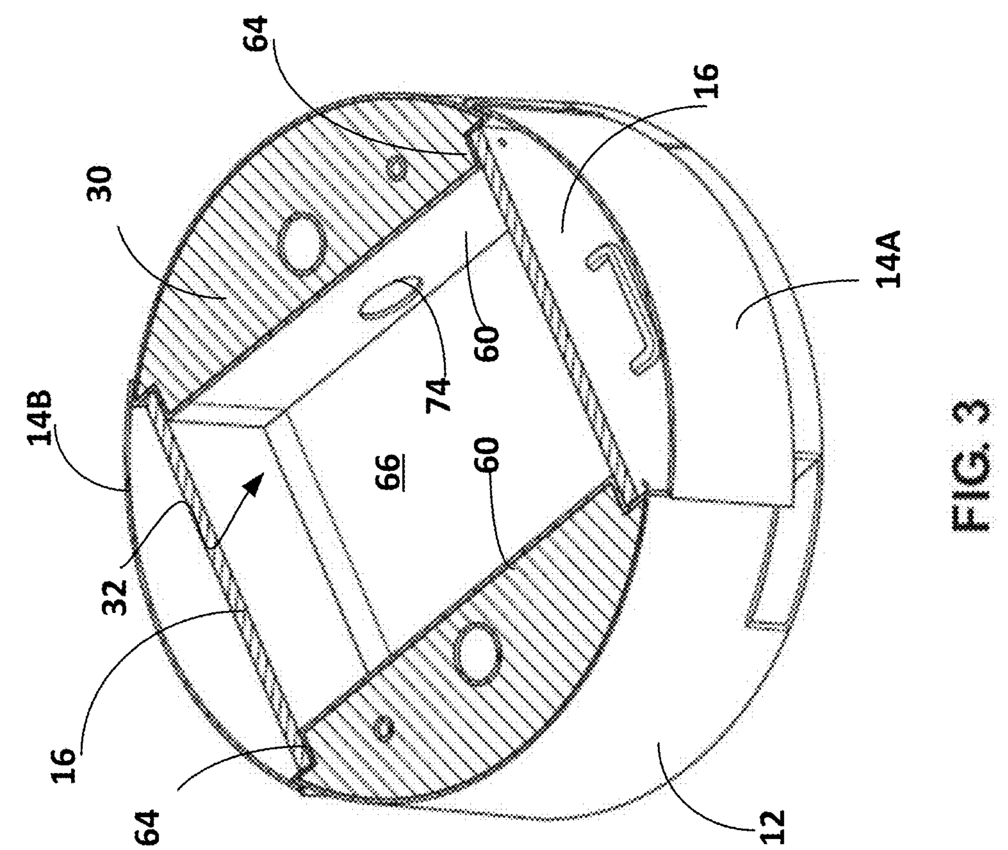
FIG. 3 is a top perspective view of the casualty-resistant enclosure of FIG. 1 with top lid removed.
Figures 5, 6, 7, 8, 9:
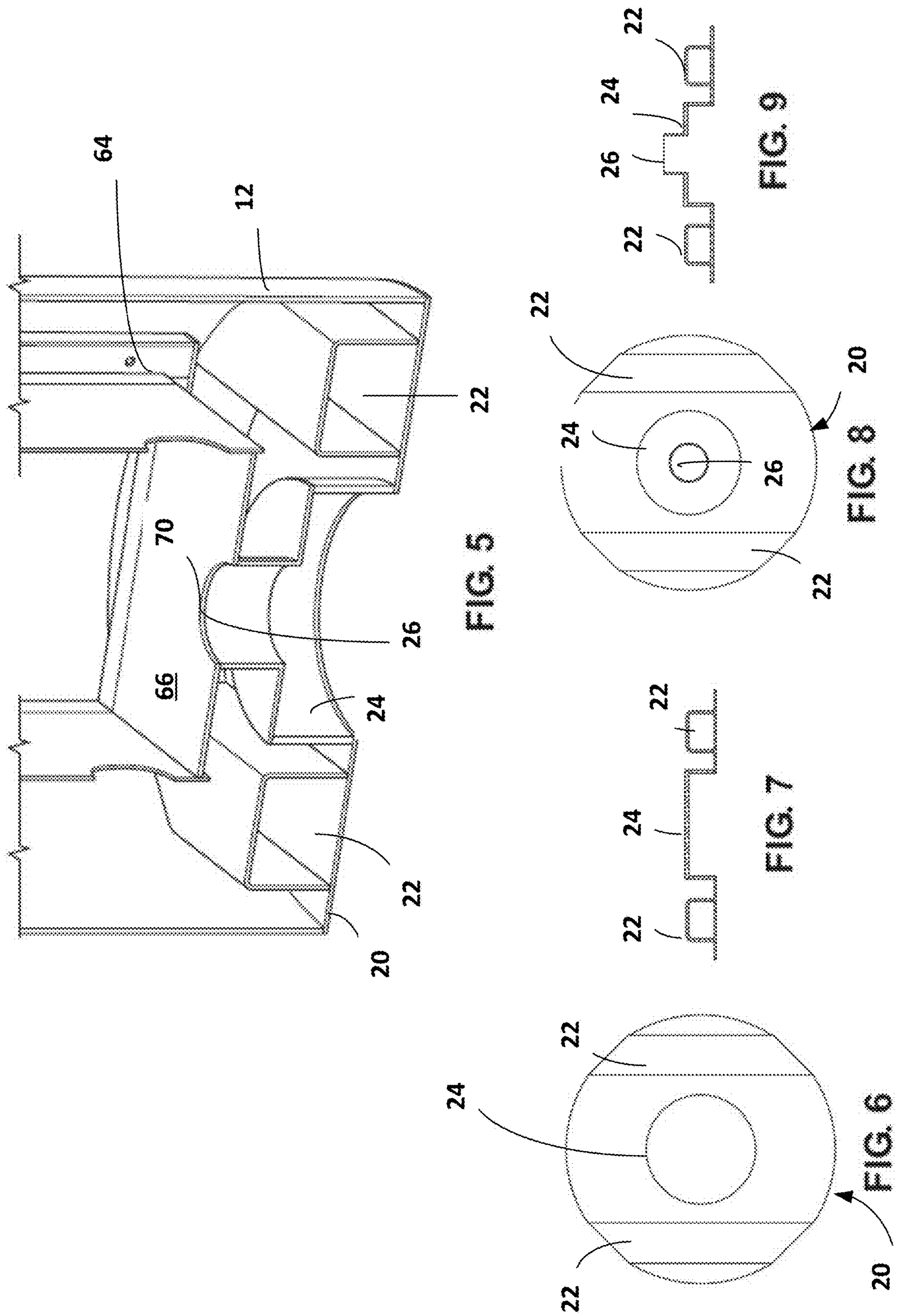
FIG. 5 is partial perspective view of a bottom plate of the casualty-resistant enclosure of FIG. 1.
FIG. 6 is a top view of a bottom plate for a casualty-resistant enclosure according to the present disclosure.
FIG. 7 is a cross-sectional view of the bottom plate of FIG. 6.
FIG. 8 is a top view of a bottom plate for a casualty-resistant enclosure according to the present disclosure.
FIG. 9 is a cross-sectional view of a bottom plate for a casualty-resistant enclosure according to the present disclosure.

In certain embodiments, see for example FIGS. 2, 6, and 7, the bottom plate 20 includes a raised central portion 24 that is whole while in other embodiments, see for example, FIGS. 5, 8 and 9, the bottom plate 20 includes a raised central portion 24 that includes an opening 26. The opening 26 enables wiring/cabling of equipment housed within the interior chamber 32 to be passed therethrough, for example, to another enclosure positioned below the enclosure 10 or to a coupling/hook-up external to the enclosure 10. The raised central portion 24 of the bottom plate 20, whether inclusive of an opening 26 or not, is a stacking feature that enables the current enclosure 10 to be stacked atop another enclosure by the raised central portion 24 interfacing with a corresponding raised central portion of the top plate 28 of the other enclosure 10.

Figure 11:
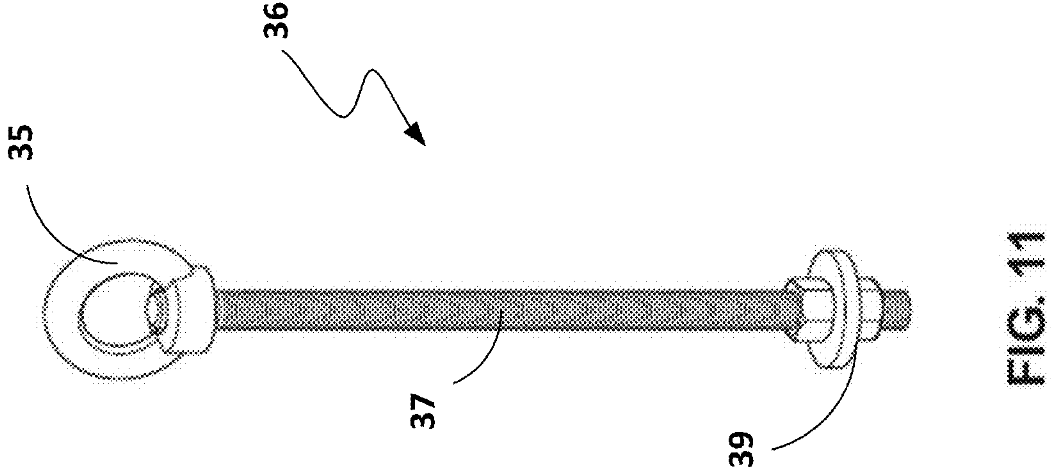
FIG. 11 is an example configuration of a lifting attachment for a casualty-resistant enclosure according to the present disclosure.

The top plate 28 is preferably fixedly securable to a second end of the exterior shell 12. The top plate 28 is typically secured at a time subsequent to a weight-enhancing material, such as concrete 30, having been poured into the enclosure 10 to fill any voids existing between the exterior shell 12 and the interior chamber 32. In certain embodiments, the top plate 28 includes one or more openings 34 for insertion of respective lifting attachments 36 prior to the top plate being secured to the exterior shell 12 and prior to the setting of the concrete 30 within the voids of the enclosure 10. An example embodiment of a lifting attachment 36 is illustrated in FIG. 11 and includes a lifting loop 35 coupled to a threaded bolt 37 with a nut 39.

Figures 12, 13, 14, 15:
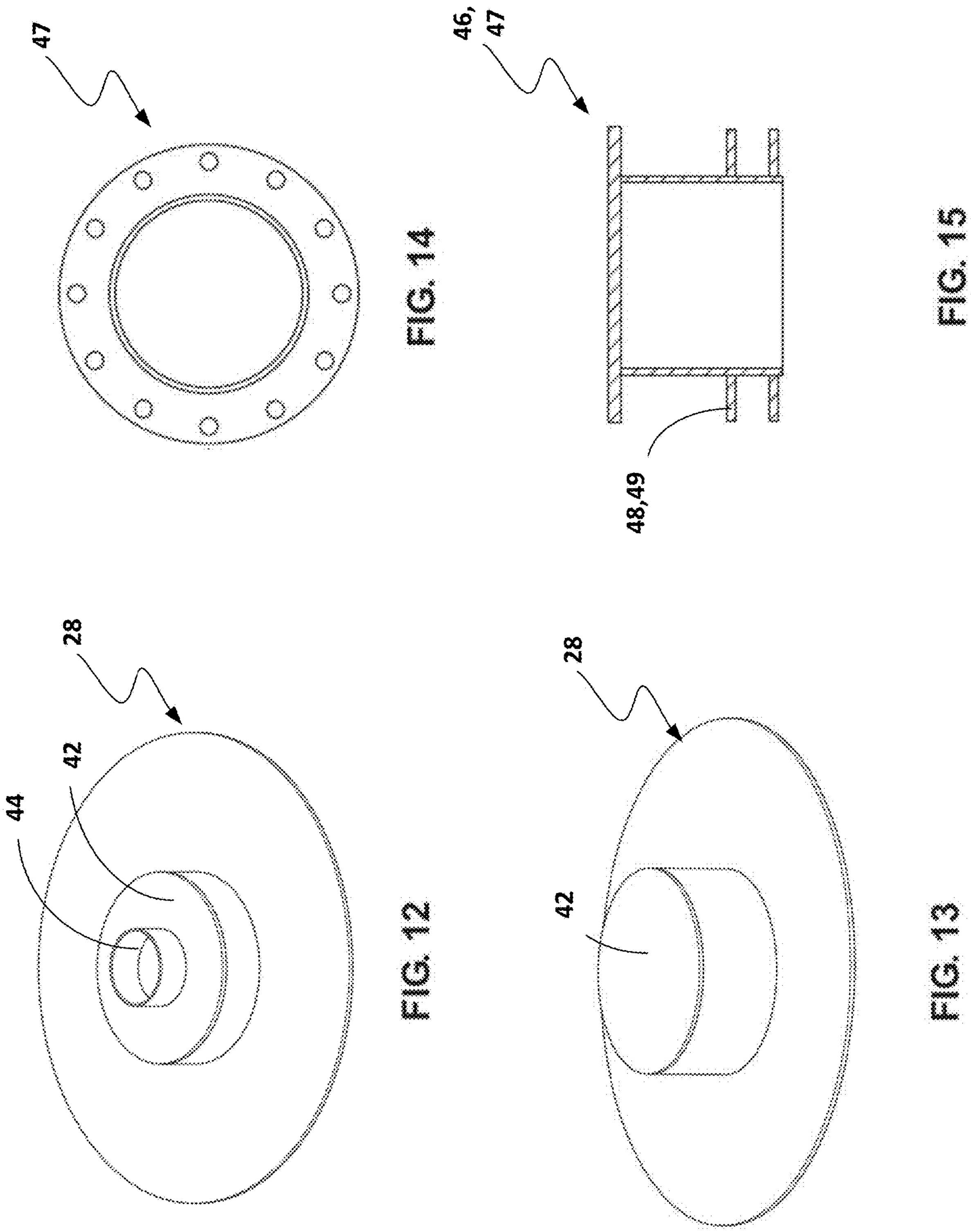
FIG. 12 a perspective view of an example configuration of a top plate for a casualty-resistant enclosure according to the present disclosure.
FIG. 13 is a perspective view of an example configuration of a top plate for a casualty-resistant enclosure according to the present disclosure.
FIG. 14 is a top view of an example configuration of a pipe flange for a casualty-resistant enclosure according to the present disclosure.
FIG. 15 is a cross-sectional view of the pipe flange of FIG. 14.
Figure 16:
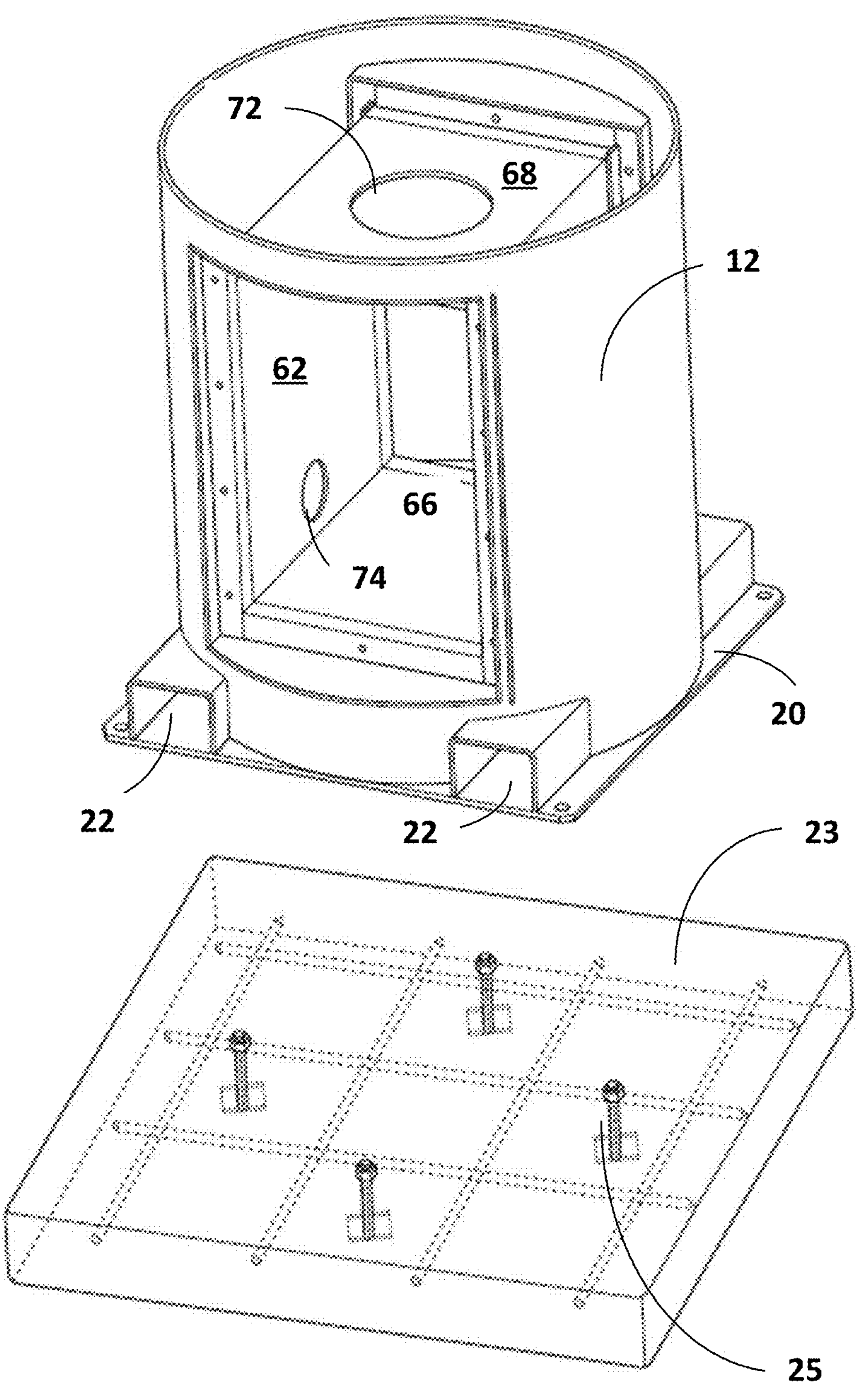
FIG. 16 is a perspective view of an example configuration of a base plate for a casualty-resistant enclosure according to the present disclosure.
Figure 17:
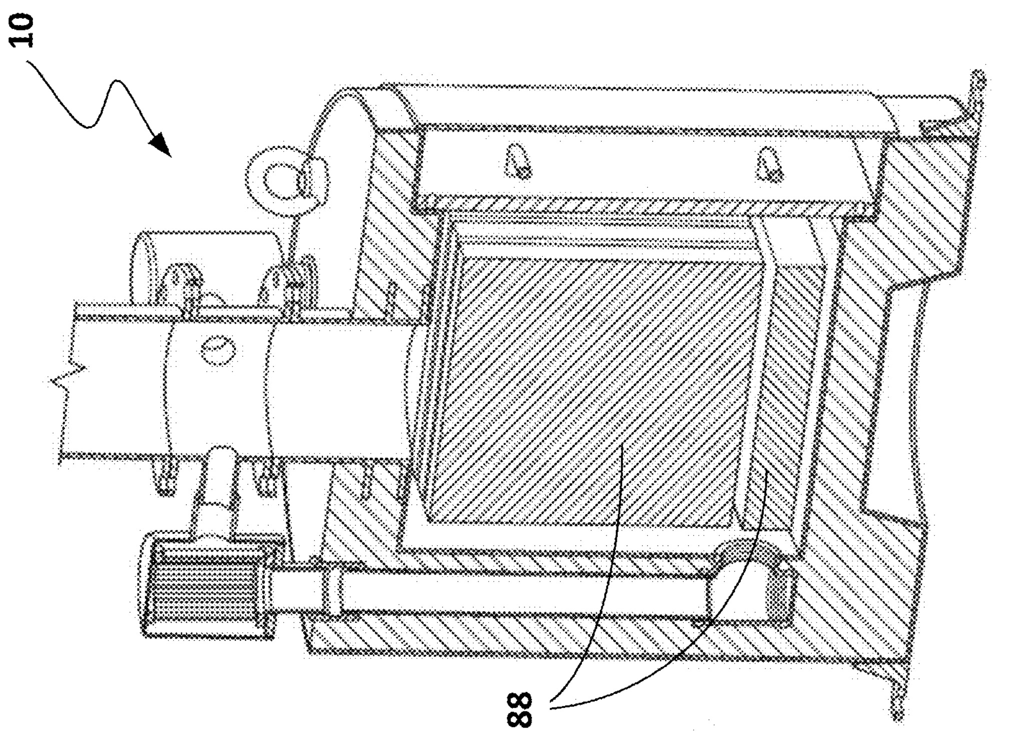
FIG. 17A is a perspective view of an example embodiment of a casualty-resistant enclosure housing electronics according to the present disclosure.
FIG. 17B is a cross-sectional view of the casualty-resistant enclosure of FIG. 17A.
Figure 17:
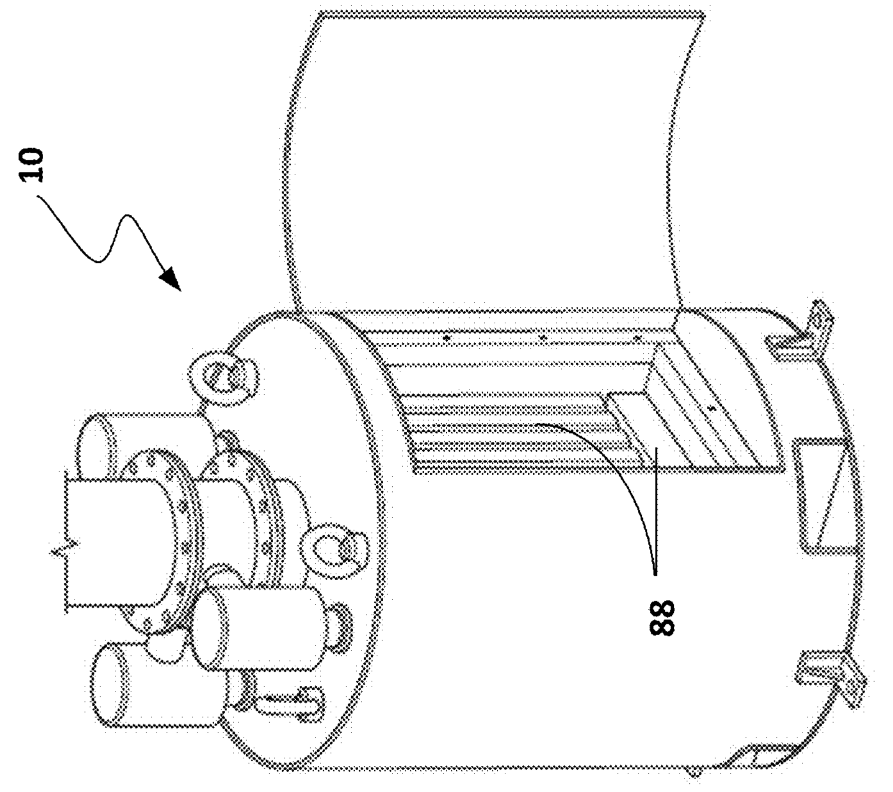

In certain embodiments, the top plate 28 includes one or more air intake openings 38, each of which are coupled at a first end to a respective air intake pipe 76 within the enclosure 10 and each of which are coupled at a second end to a respective air intake box 40 external to the enclosure 10. In certain embodiments, the top plate 28 includes a raised central portion 42 that includes a vent opening 44 (see FIG. 12) through which wiring/cabling of equipment housed within the enclosure 10 may be passed to another enclosure 10 (or passed to a coupling/hook-up external to the enclosure 10) and through which heat generated by the micro data center equipment (e.g., heat-generating electronic equipment/electrical components 88) within the interior chamber 32 can be vented. A coupling 46, such as an attachment collar 47 shown in FIGS. 1-2 and 14-15, engages with the vent opening 44 to extend the venting of heat outside the exterior housing 11 and to enable other external components to interface with the enclosure 10. In certain embodiments, the coupling 46 that engages with the opening 44 includes an anchoring feature 48, such as the anchor collar 49 shown in FIGS. 2 and 15. The anchoring feature 48 functions to anchor the coupling 46 within setting concrete 30 that has been received within the one or more voids of the enclosure 10. In certain embodiments, the raised central portion 42 of the top plate 28 is whole, e.g., without vent opening 44 (see FIG. 13). The raised central portion 42 of the top plate 28, whether inclusive of the vent opening 44 or not, is a stacking feature that enables the current enclosure 10 to be stacked below another enclosure 10 by the raised central portion 42 interfacing with a corresponding raised central portion 24 of the bottom plate 20 of the other enclosure 10.

Figure 20:
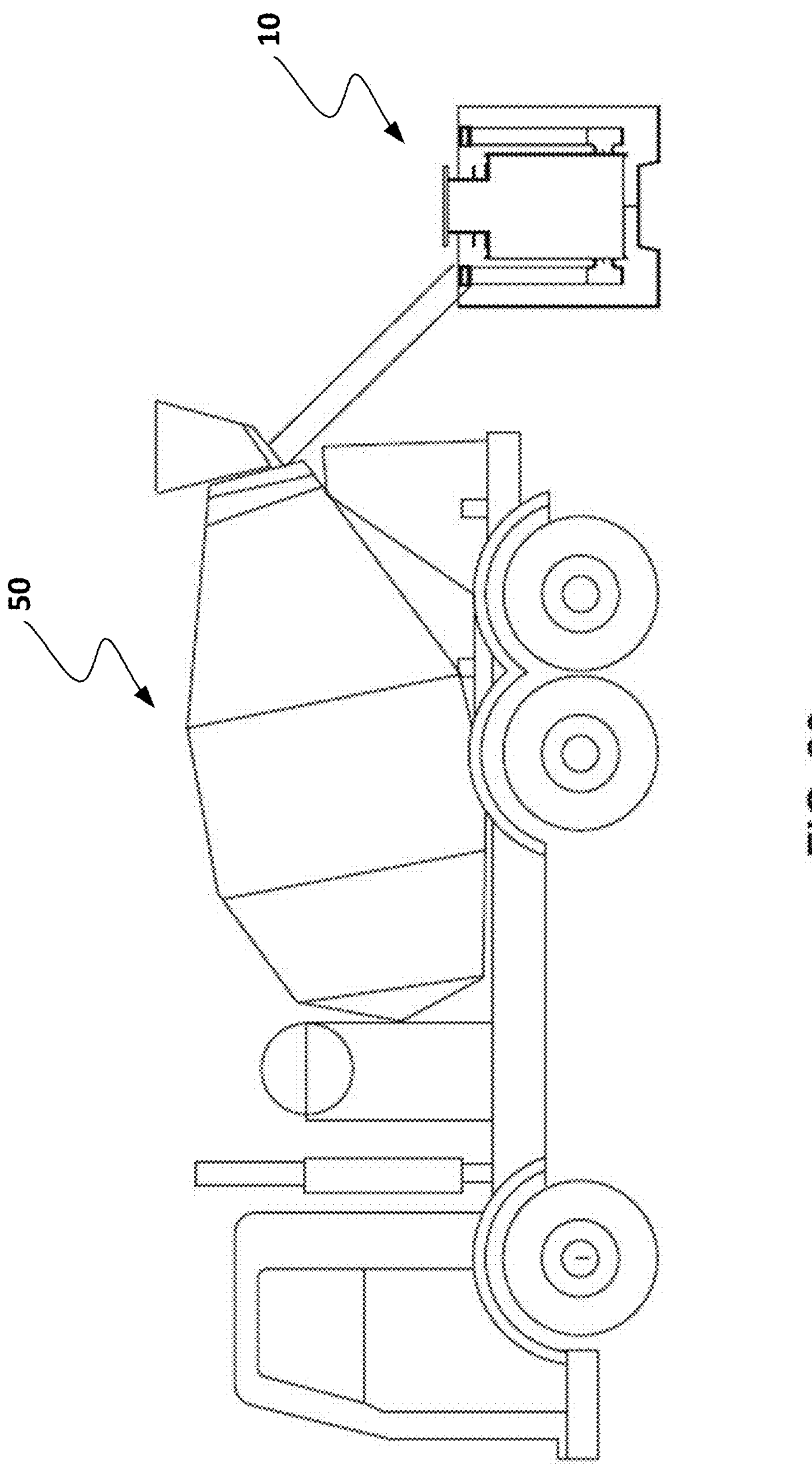
FIG. 20 is an example set-up for filling a casualty-resistant enclosure with concrete according to the present disclosure.

Notably, the stacking of enclosures 10 can occur with or without the respective enclosures 10 having been filled with concrete 32. The stacking of enclosures 10 without concrete 32 (e.g., stacked at a reduced weight) enables the shipping of multiple stacked enclosures 10 at reduced cost to a location that is at or near a desired point of deployment where final assembly of the enclosures 10, such as filling with concrete 30 (by way of example see FIG. 20 with concrete truck 50 filling an exemplary enclosure 10) and securing the top plate 28 to the exterior shell 12, can occur. The coupling of any additional external components to the respective enclosures 10 can also occur at this time along with the positioning/mounting of any electronics within the interior chamber 32 of the respective enclosures 10.

Figure 21:
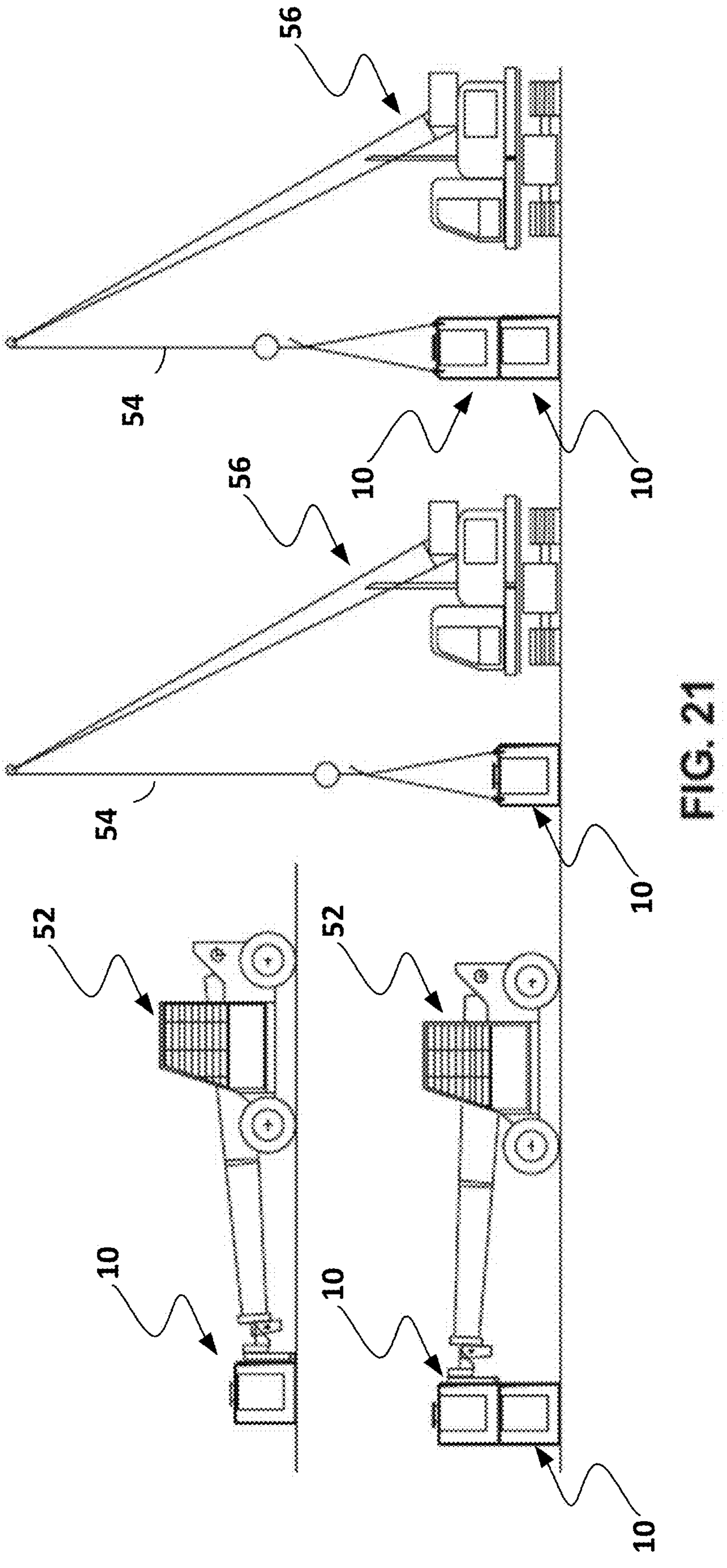
FIG. 21 illustrates example set-ups for lifting and stacking casualty-resistant enclosures according to the present disclosure.
Figure 22:
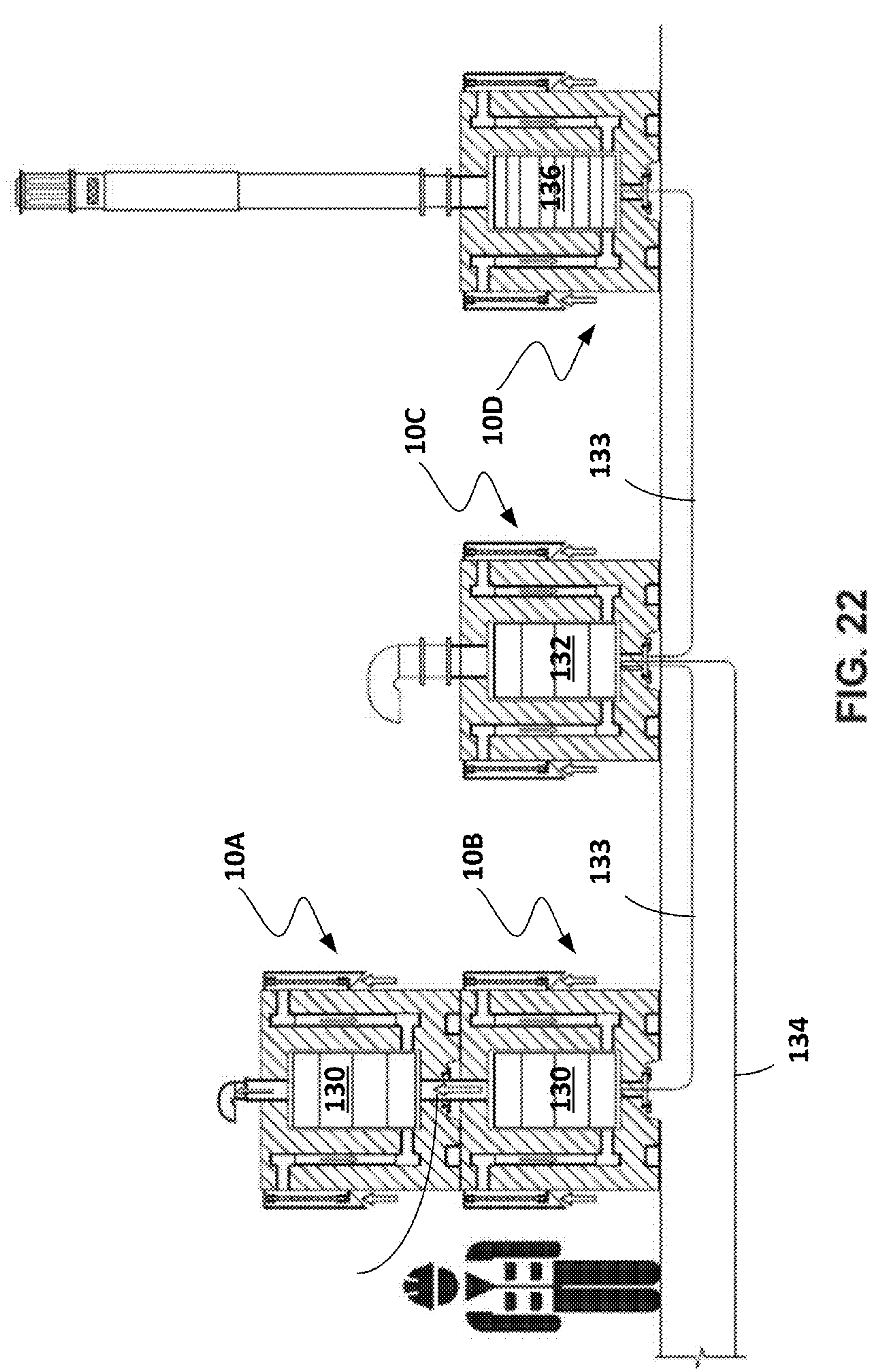
FIG. 22 illustrates an example set-up of a deployed data communications network utilizing a plurality of casualty-resistant enclosures according to the present disclosure.

Alternatively, a plurality of enclosures 10 can be shipped with set concrete in a partially or fully assembled configuration (e.g., with or without the top plate 28 secured and/or with or without external components coupled to the enclosure 10). FIG. 21 illustrates that the tines (not shown) of a forklift 52 can interface with the forklift tine openings 22 of the bottom plate 20 to lift, lower, stack, and/or otherwise position an enclosure 10, with or without concrete 30, as desired. FIG. 22 also illustrates that a load line 54 of a crane 56 can interface with one or more lifting attachments 36 of the enclosure 10 to lift, lower, stack, and/or otherwise position the enclosure 10, with or without concrete 30, as desired.

C. Interior

An interior of the enclosure 10 generally comprises the interior chamber 32, which is designed to house the micro data center equipment (e.g., heat-generating electronic equipment/electrical components 88), and one or more air intake pipes 76 that supplies cooling air to the electronic equipment/electrical components 88 within the interior chamber 32. The interior chamber 32 of the enclosure 10, which is best seen in FIGS. 2-5, is positioned centrally within and secured to the exterior shell 12 of the enclosure 10; the interior chamber 32 can additionally be secured to one or both of the bottom plate 20 and the top plate 28. The interior chamber 32 is generally of a square or rectangular configuration having a first side wall 60, a second side wall 62 parallel to the first side wall 60, a floor plate 66 oriented perpendicular to and joining the first side wall 60 and the second side wall 62, and a ceiling plate 68, oriented parallel to the floor plate 66, joining the first side wall 60 and the second side wall 62.

At the point where the first side wall 60 and the second side wall 62 approach the exterior shell 12 of the enclosure 10, a recessed front edge 64 is provided at one or both ends of the first side wall 60 and the second side wall 62. The recessed front edge 64 presents a flat surface against which the bullet-proof access panel 16 is secured by screws, bolts, pins, latches, and/or other suitable securing means. In embodiments where the enclosure 10 includes only a single door 14A, the interior chamber 32 additionally includes a back wall (not shown) that joins the first side wall 60, the second side wall 62, the floor plate 66, and the ceiling plate 68.

In certain embodiments, the floor plate 66 is provided with one or more openings 70 through which wiring/cabling may be passed while in other embodiments the floor plate 66 is without openings. The ceiling plate 68 is provided with one or more vent openings 72 through which wiring/cabling may be passed and heat generated by the heat-generating electronic equipment/electrical components 88 is expelled from the interior chamber 32; at least one of the vent openings 72 is preferably aligned with the vent opening 44 of the top plate 28. Further, one or more of the first side wall 60, the second side wall 62, and the back wall include an airflow opening 74, through which outdoor air is passed, via the air intake pipe 76, from the corresponding air intake opening 38 to ventilate and cool the interior chamber 32. The air intake pipe 76 is coupled intermediate corresponding pairs of airflow openings 74 at the interior chamber 32 of the enclosure 10 and air intake openings 38 at the exterior shell 12 and/or the top plate 28 of the enclosure 10.

Figure 10:
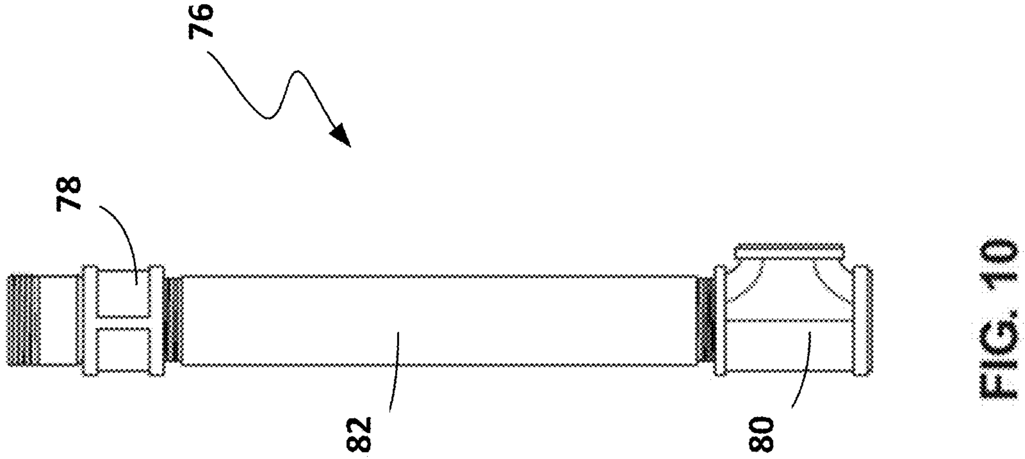
FIG. 10 is an example configuration of an air-flow pipe for a casualty-resistant enclosure according to the present disclosure.

The air intake pipe 76 may comprise any type of application-suitable piping that is capable of being coupled at a first end to the air intake opening 38 and that is capable of being coupled at a second end to the air flow opening 74. An example embodiment of an application-suitable air intake pipe 76 is illustrated in FIG. 10 and includes a female pipe thread (FPT)×FPT coupling 78 that provides the air intake opening 38, a tee coupling 80 coupled to the air flow opening 38, and a pipe spool 80 that is coupled at a first end to the FPT×FPT coupling 78 and coupled at a second end to the tee coupling 78. Another example embodiment of an air intake pipe 76 is one that is capable of being welded at a first end to the air intake opening 38 and capable of being welded at a second end to the air flow opening 74. It should be appreciated that the positioning of the air intake pipe 76 relative to the interior chamber 32 defines a "bullet-proof" path to the interior chamber 32—in other words it would be impossible for a bullet aimed at the enclosure 10 to enter the air intake pipe 76 and travel to the interior chamber 32.

The air intake opening 38 of the air intake pipe 76 is designed to interface with a corresponding air intake box 40 that is preferably externally coupled to the air intake opening 38 during final assembly of the enclosure 10, e.g., subsequent to setting of the concrete 30 and subsequent to securing the top plate 28 to the enclosure 10. The air intake box 40 includes one or more openings 84 to receive air from an external outdoor air source. The air intake box 40 preferably also includes an air filter 86 enabling air entering the air intake box 40 to be cleaned prior to reaching any electronics within the interior chamber 32; the air delivered to the interior chamber 32 provides a cooling effect to the electronics.

The cooling effect of the air delivered from the air intake box 40 to the interior chamber 32 can optionally be enhanced by a Joule Force™ cooling array that is positioned to communicate cooled air to the interior chamber 32. The Joule Force™ cooling array, which does not require water for cooling, is engineered for high-density heat removal such as the heat generated by electronic equipment/electrical components 88 positioned/mounted within the interior chamber 32. FIGS. 17A-17B illustrate an enclosure with the interior chamber 32 equipped with electronic equipment/electrical components 88 suited to a specific application. The electronic equipment/electrical components 88 may include, but are not limited to, processors, transceivers, sensors, data storage, global navigation satellite systems (GNSS), telecommunications equipment, audio/video equipment, security system equipment, batteries, and fans. One or more fans within the interior chamber 32 (and/or in communication with the interior chamber 32; e.g., see fan 89 in FIG. 18) can be used to: draw outside air through the air intake pipe 76 and into the interior chamber 32; provide additional cooling to the electronic equipment/electrical components 88; and/or help to expel heat/hot air generated by the electronic equipment/electrical components 88 from the interior chamber 32 (see fan 89 in FIG. 18).

Figure 18:
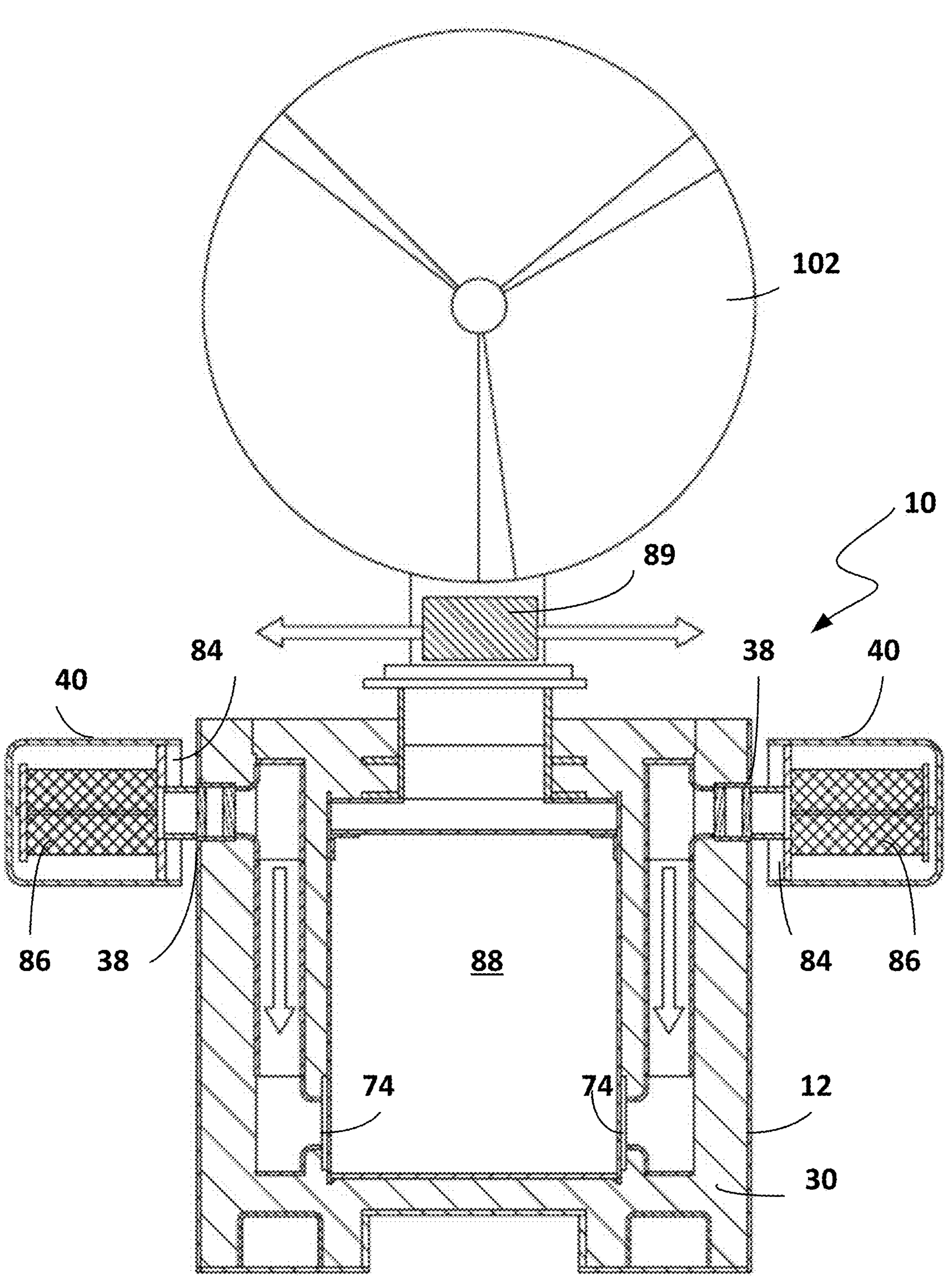
FIG. 18 is a cross-sectional view of an example embodiment of a casualty-resistant enclosure according to the present disclosure.
Figure 19:
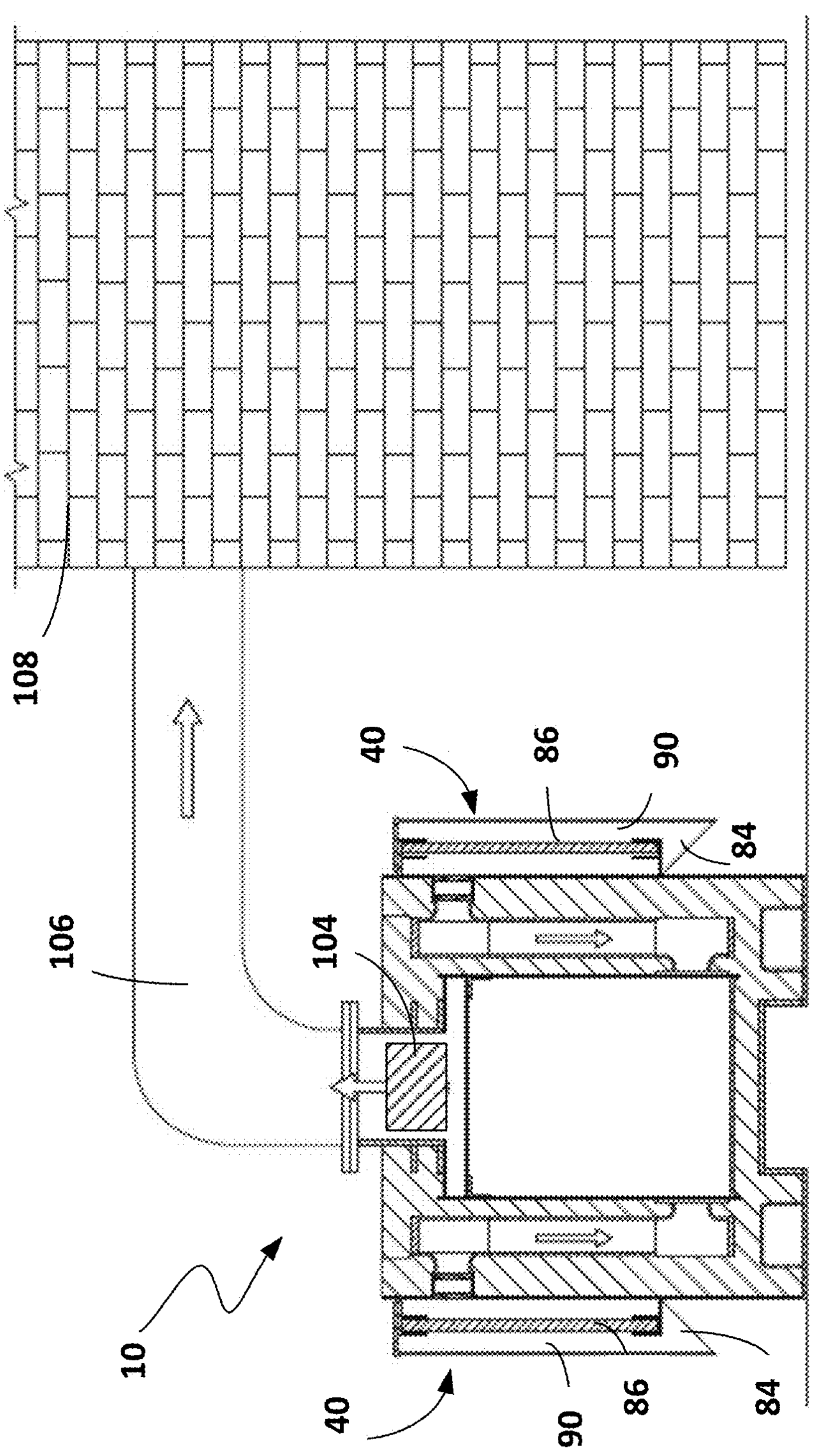
FIG. 19 is a cross-sectional view of an example embodiment of a casualty-resistant enclosure according to the present disclosure.

It should be appreciated that while the air intake openings 38, and air intake boxes 40, are shown in FIGS. 1-17B as being located at the top plate 28 of the enclosure 10, the air intake openings 38 and air intake boxes 40 may also, or alternatively, be positioned at the exterior shell 20 as illustrated in FIGS. 18 and 19. FIG. 19 also illustrates an alternative air intake box 40 configuration with a hinged shell 90 and air opening 84. The hinged shell 90 is raisable to reveal an air filter 86. Notably, regardless of the configuration of the air intake box 40 the outer shell of the air intake box 40 is removable/raisable to provide access to the air filter 86 for replacement without ever having to access the interior chamber 32 of the enclosure 10.

D. Materials, Size, Weight, and Benefits Thereof

In a preferred embodiment, the exterior shell 12, a single door 14A, a single bullet-proof access panel 16, the bottom plate 20, the top plate 28, and the entirety of the interior chamber 32 of the enclosure 10 are fabricated from 3/16 inch (4.75 mm) mild steel (a.k.a. low-carbon steel) plate with the interior chamber 32, the bottom plate 20, and the top plate 28 welded to the exterior shell 12 of the enclosure; the interior chamber 32 itself is also created by welding together its respective components, i.e., the first side wall 60, the second side wall 62, the floor plate 62, the ceiling plate 68, and back wall (if used). The air intake pipe 76 is preferably a three inch (75 mm) Schedule 40 steel pipe that is weldable and/or threadably attachable to the air intake opening 38 of the exterior housing 11 and the air flow opening 74 of the interior chamber 32.

Further, in the preferred embodiment, the exterior shell 12 of the enclosure 10 is of a round configuration, which is suited to deflecting debris such as bullets, with a diameter of 1 meter (~3.3 feet). A height of the enclosure 10, from the top plate 28 to the bottom plate 20, is also 1 meter (~3.3 feet)

with the resulting enclosure 10, absent concrete 30, weighing approximately 550 pounds (250 kilograms). A preferred height, width, and depth of the inside of the interior chamber 32 are approximately 26.5 inches (675 mm), 20.5 inches (520 mm), and 25.4 inches (645 mm), respectively.

In the preferred embodiment, the voids between the interior chamber 32, the air intake pipes 74, and the exterior shell 12 of the enclosure 10 are filled with plain concrete 30 to produce an enclosure 10 that weighs approximately 4000 pounds (~1814 kilograms). Alternatively, the voids between the interior chamber 32, the air intake pipes 74, and the exterior shell 12 of the enclosure 10 are filled with low density cellular concrete 30 (LDCC) to produce an enclosure 10 that weighs approximately 1235 pounds (~560 kilograms).

It should be appreciated that the material, size, connections, and weight of the enclosure 10 itself as well as the material, size and weight of the weight-enhancing material filling the voids in the enclosure 10 can be modified to suit a particular application without departing from the spirit or scope of the invention.

In certain embodiments, one or more of the mild steel components noted above is coated with one or more suitable coatings, known to those in the art, that are capable of providing thermal insulation, electrical insulation, and/or rust protection of the mild steel components.

Utilizing the materials, sizes, and weights noted herein, the enclosure 10 may be deemed a casualty-resistant enclosure (C-RE) which is particularly suited for hostile environments. Advantages of the CR-E include but are not limited a ruggedized and secure design that includes:

A. Physical Security—The C-RE features a steel-encased, concrete-filled structure that is fire, theft, vandalism, and bullet resistant. Its reinforced base deflects debris and bullets, making it suitable for deployment in conflict zones, disaster areas, and remote sites.

B. Environmental Protection—The C-RE is designed to withstand harsh weather, physical impacts, and vibrations, ensuring reliable operation in extreme environments.

C. Faraday Cage Effect—The steel and concrete composite construction of the C-RE also acts as a Faraday cage, shielding sensitive electronics from electromagnetic interference and eavesdropping. 3

D. Water-Free Cooling—Integration of the C-RE with Joule Force Cooling allows for high-density heat removal without water or air conditioning, which is suitable for remote and water challenged locations.

E. Combat and Training Support: The C-RE serves as a secure, deployable communications hub for military operations, supporting command and control, intelligence gathering, and cryptographic operations.

Further, the combined use of steel and concrete in the C-RE provide:

A. Ballistic and Physical Threat Protection—The steel provides high tensile strength and ductility, enabling the enclosure 10 to absorb and disperse forces from explosions, bullets, and shrapnel, which is vital in conflict zones where ballistic threats are common. The concrete, when reinforced by the steel exterior housing, provides mass and rigidity that further shields against projectiles and blasts, e.g., the C-RE's steel-encased, concrete-filled design creates a robust barrier that deflects and absorbs impacts, making it highly resistant to bullets and debris.

B. Environmental and Fire Resistance—The steel is non-combustible and highly durable, resisting fire and environmental hazards such as extreme weather and earthquakes. The concrete aids in temperature regulation and fire resistance, adding another layer of protection for sensitive electronic equipment inside the C-RE.

C. Thermal and EMF Shielding—The steel and concrete together act as an effective Faraday cage, shielding sensitive electronics from electromagnetic interference (EMI) and potential eavesdropping or jamming, which is critical for secure communications in contested environments.

D. Structural Integrity and Stability—The steel and concrete reinforced construction of the C-RE ensures that any micro data center incorporated therein remains stable and functional despite vibrations, shocks, and physical stresses common in conflict zones. This reliability is essential for maintaining continuous data processing and communication capabilities. For further details on a micro data center see, for example, Section A—Overview and Section F—Alternative Embodiments, Applications, and Deployment Configurations.

E. Rapid Deployment and Adaptability—The use of widely available steel and concrete allows for quick, local manufacturing and deployment, reducing logistics challenges in remote or unstable.

TABLE 1

Summary of Steel and Concrete Benefits of Enclosure 10

| Feature | Steel Benefit | Concrete Benefit | Combined Impact in Conflict Zones |
|---|---|---|---|
| Ballistic Protection | Absorbs/ disperses force | Deflects/shields projectiles | Enhanced survival in attack scenarios |
| Fire Resistance | Non-combustible | Slows heat transfer | Protects equipment from fire/explosions |
| EMF Shielding | Faraday cage effect | Adds mass for insulation | Prevents electronic eavesdropping/ jamming |
| Structural Integrity | High strength, ductility | Rigidity, stability | Maintains operation under stress/shock |
| Rapid Deployment | Easy to fabricate/ modify | Easy to cast/ reinforce onsite | Quick setup in remote/volatile areas |

E. Assembly

Assembly of the enclosure 10 can be completed at a single location where the enclosure 10 can then be shipped, in a stacked or unstacked configuration, to another location for deployment. Alternatively, the assembly of the enclosure can be completed at a single location and directly deployed to a nearby location.

Still another alternative includes partially assembling the enclosure 10 at a first location and shipping the partially assembled enclosures 10, in a stacked or unstacked configuration, to a second location for completion of assembly.

The assembly steps for the enclosure 10 that can be completed at a single location or at a first location include: (a) welding the bottom plate 20 to the first end of the exterior shell 12; (b) welding the interior chamber 32 to the exterior shell 12; and (c) coupling the air intake pipe 76 between the air intake opening 38 and the airflow opening 74.

At this point, while at the single location or after being shipped to the second location, additional assembly steps for the enclosure 10 include: (a) filling the void between the exterior shell 12 and interior chamber 32 with concrete 30; (b) welding the top plate 29 to the second end of the exterior shell 12; and (c) positioning the electronic equipment/ electrical components 88 within the interior chamber 32; (d) securing the bullet-proof access panel 16 to the interior chamber 32; and (e) closing the door 14A on the bullet-proof access panel 16.

F. Alternative Embodiments, Applications, and Deployment Configurations

Figure 23:
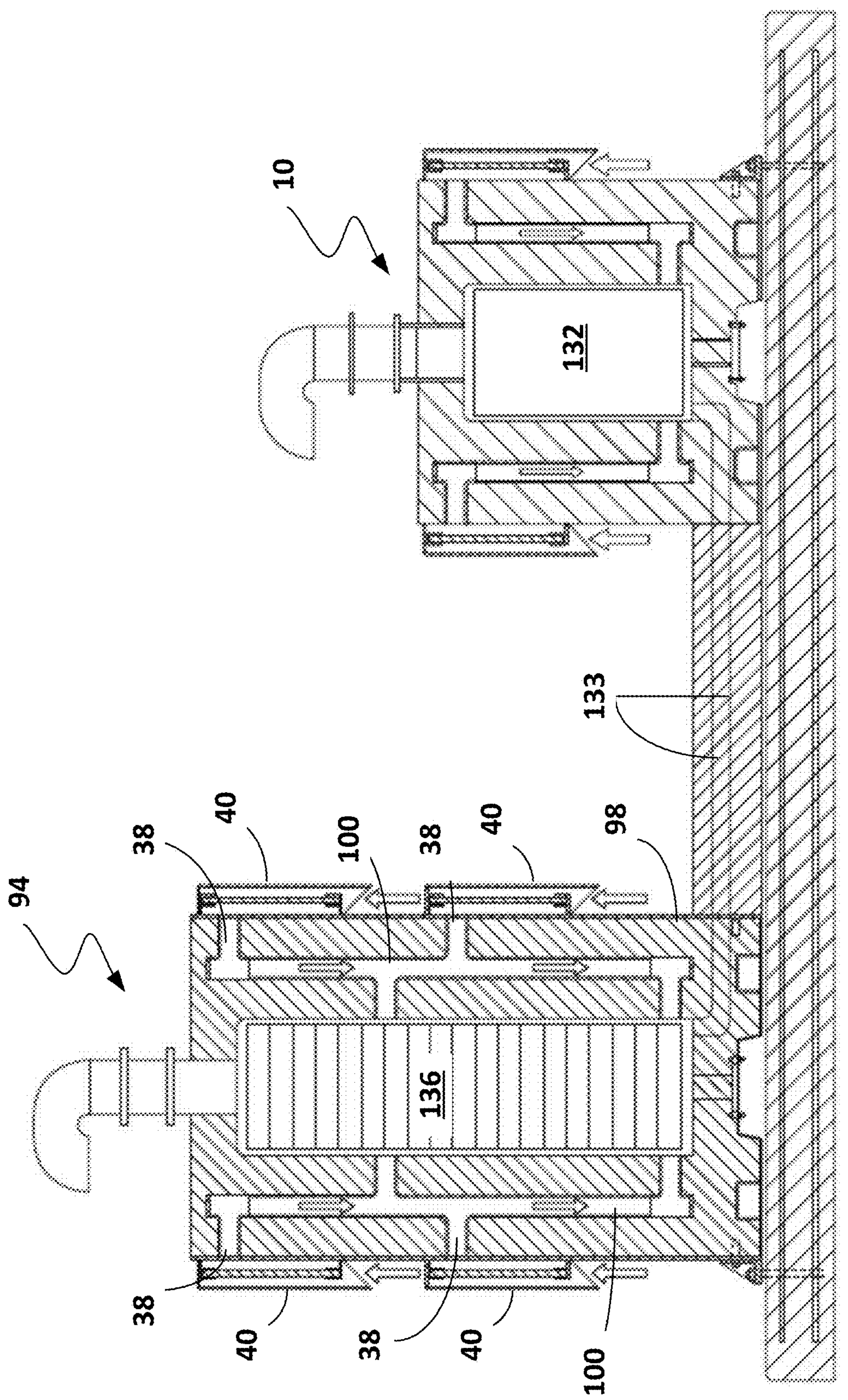
FIG. 23 illustrates an example set-up of a deployed data communications network utilizing a plurality of casualty-resistant enclosures according to the present disclosure including a double-height casualty-resistant enclosure.

As described previously herein, an example alternative embodiment of the enclosure 10 includes positioning one or more air intake openings 38 on the exterior shell 12 rather than on the top plate 28 of the enclosure as shown in FIGS. 18-19 as well as FIGS. 22-23. Another alternative embodiment, previously referenced herein, includes stacking one enclosure 10 atop another enclosure 10 and establishing an open channel 92 between the two enclosures 10 through use of a top plate 28 with the opening 44 in the lower enclosure 10 and a bottom plate 20 with the opening 26 in the upper enclosure 10 as illustrated in FIG. 22. Still another alternative embodiment, not previously described, includes reconfiguring the enclosure 10 as a double-height enclosure 94 in a singular unit configuration. An example of the double-height enclosure 94 is illustrated in FIG. 23 with an elongated interior chamber 96, an elongated exterior shell 98, and four air intake openings 38 that are in communication with one of two elongated air intake pipes 100.

As noted herein, the enclosure 10 is especially suited for housing heat-generating electronic equipment/electrical components 88 that are used in the establishment of a single micro data center or in the establishment of a micro data center system that provides communications among a plurality of enclosures 10 (a micro data center is a small, self-contained data center designed to house IT equipment and provide data processing and storage capabilities in a compact space while a micro data center system comprises a network of micro data centers). Particular applications that take advantage of the micro data center design of one or more enclosures 10 include, but are not limited to, the following example applications.

A first example application is that of a satellite download point as illustrated in FIG. 18. In this application, the enclosure 10 supports a satellite dish 102 that is communicatively coupled to electronic equipment/electrical components 88 housed within the interior chamber 32 of the enclosure 10. The electronic equipment/electrical components 88 function to facilitate data transfer and communication in isolated environments thereby ensuring continual access to information regardless of terrestrial connectivity. The steel and concrete encasement of the enclosure 10 acts as a Faraday cage reducing electromagnetic interference from external sources—this functionality protects the integrity of data transmission. Further, the electromagnetic shielding provided by the enclosure helps to deter eavesdropping or interception of electronic transmissions. Additional EMF security can be provided by wrapping the interior chamber 32 with copper, aluminum, paints, fabrics or other shielding materials.

A second example application of the enclosure 10 is that of a heat source whereby the heat generated by the electronic equipment/electrical components 88 and other components housed by the enclosure 10 is expelled from the interior chamber 32 by a fan 104, through ductwork 106, to heat one or more of a building 108, tent, shop, greenhouse, water supply, etc., as illustrated in FIG. 19.

Figures 25, 26:
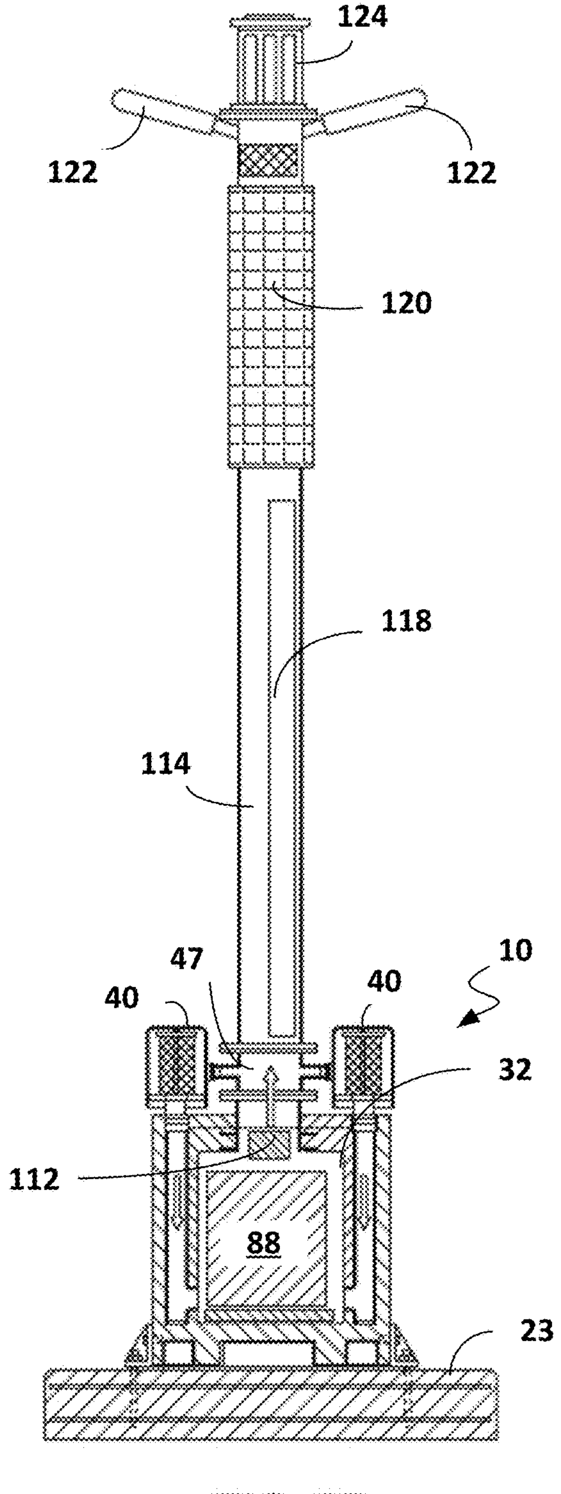
FIG. 25 illustrates an example configuration of a casualty-resistant enclosure configured to function as a micro data center hub according to the present disclosure.
FIG. 26 illustrates an example configuration of a telescoping pipe usable with the micro data center hub of FIG. 25.

A third example application of the enclosure 10 is that of a micro data center hub 110 variations of which are illustrated in FIGS. 22 and 25. A detailed description of the micro data center hub 110 is provided hereinbelow with reference to FIG. 25. As shown in FIG. 25, the micro data center hub 110 includes a single enclosure 10 (alternatively, the micro data center hub 110 may include a stack of two enclosures 10 or a double height enclosure 94) with electronic equipment/electrical components 88 housed within the interior chamber 32 along with a fan 112 for drawing air through the enclosure 10; the enclosure 10 is mounted atop a concrete support pad 23. Air intake boxes 40 are coupled to the enclosure as described earlier herein. Also coupled to the enclosure 10, via an attachment collar 47 and in communication with the interior chamber 32, is a pole 114. In certain embodiments, the pole 114 comprises a 10¾ inch J-55 standard oil well production casing or a 10 inch schedule 40 pipe. FIG. 26 illustrates that the pole 114 can be extended in height through use of one or more tower extensions 116, which can comprise, by way of example, a 4.5 inch well casing. Continuing with FIG. 25, the micro data center hub 110 may include additional devices/batteries 118 external to the interior chamber 32 and within the pole 114 that, along with the electronic equipment/electrical components 88, support the functioning of one or more solar panels 120, lights/cameras 122, cellular antennas 124, and/or other devices mounted to the pole 114.

Other example micro data center applications of the enclosure 10 include, but are not limited to, one or a plurality of enclosures 10 that are configured to function as cellular communication/WiFi stations, EV charging stations, signal repeating towers, air quality monitoring stations, radiation detection and tracking stations, drone detection stations, local "off-grid" GPS stations, alert sirens/warnings/public announcement stations, lighting stations, frequency/noise detection stations, and surveillance camera/thermal imaging stations.

As indicated herein, a single enclosure 10 can be configured as a stand-alone micro data center suitable for multiple and various applications. A plurality of enclosures 10 can be deployed as a system or network of enclosures 10 where one enclosure 10 is in wired or wireless data communication (and/or electrical communication) with one or more other enclosures 10. Example deployment configurations of a plurality of enclosures 10 in a micro data system or network include, but are not limited to, those illustrated in FIGS. 22-24.

FIG. 22 illustrates that a double stack of enclosures 10A, 10B, which house batteries 130, are electrically and communicatively coupled, via cabling 133, to an enclosure 10C, which houses electrical switchgear and other electronic equipment for controls and monitoring 132; power is supplied to enclosure 10C through via power supply line 134. Enclosure 10C is electrically and communicatively coupled, via cabling 133, to enclosure 10D which is configured as a micro center data hub 110. Notably enclosures 10A, 10B, and 10C are configured to vent heated air from within the interior chamber 32 to the environment.

FIG. 23 illustrates that a double height enclosure 94, which houses data center equipment 136 is electrically and communicatively coupled, via cabling 133, to an enclosure 10 that is housing electrical switchgear and other electronic equipment for controls and monitoring 132.

Figure 24:
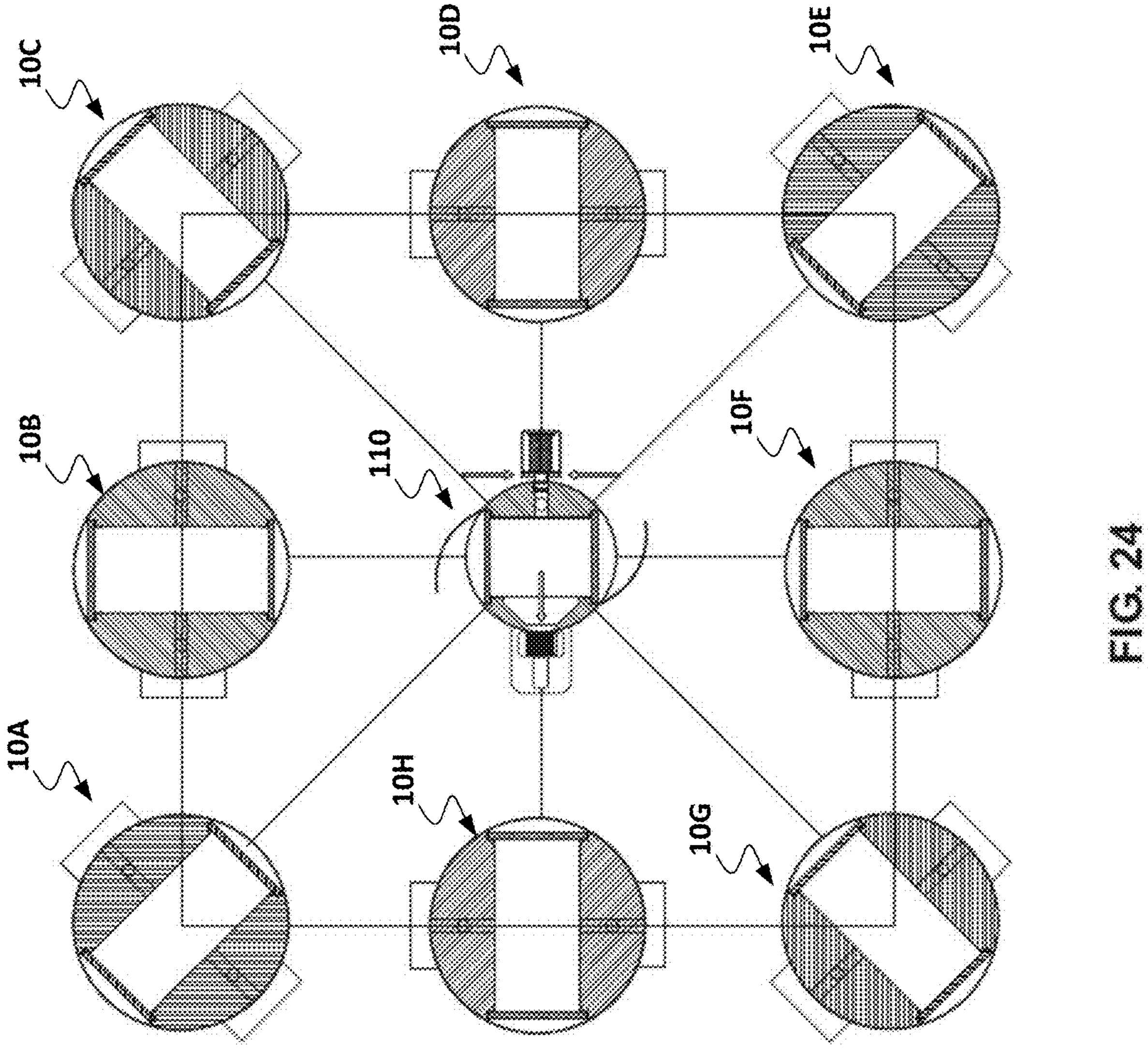
FIG. 24 illustrates an example set-up of a deployed data communications network utilizing a plurality of casualty-resistant enclosures according to the present disclosure.

FIG. 24 illustrates a centrally located micro data center hub 110 in wired (or wireless) and/or electrical communication with enclosures 10A-10H, which may be configured to perform one or more dedicated functions such as data storage, backup data storage, controls/monitoring, power supply, etc.

While various embodiments have been described above, it should be understood that they have been presented by way of example only, and not limitation. The descriptions are not intended to limit the scope of the technology to the particular forms set forth herein. To the contrary, the present descriptions are intended to cover such alternatives, modifications, and equivalents as may be included within the spirit and scope of the technology as defined by the appended claims and otherwise appreciated by one of ordinary skill in the art. The various embodiments of the present disclosure may be embodied in other specific forms without departing from the spirit or essential attributes thereof, and it is therefore desired that the various embodiments in the present disclosure be considered in all respects as illustrative and not restrictive. Thus, the breadth and scope of a preferred embodiment should not be limited by any of the above-described exemplary embodiments.

Unless otherwise defined, all technical and scientific terms used herein have the same meaning as commonly understood by one of ordinary skill in the art to which this invention belongs. All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls. Any headings utilized within the description are for convenience only and have no legal or limiting effect.

What is claimed is:

1. An enclosure for micro data center equipment, comprising:

- an interior chamber that houses heat-generating micro data center equipment;
- an exterior housing that substantially surrounds the interior chamber, wherein the exterior housing is comprised of a material that is casualty-resistant and is resistant to hostile environments;
- an air intake pipe that is coupled between an opening in the interior chamber and an opening in the exterior housing, wherein the air intake pipe receives outdoor air from a location external to the exterior housing at the opening in the exterior housing, wherein the air intake pipe delivers the outdoor air and wherein the outdoor air serves to cool the heat-generating micro data center equipment; and
- a void intermediate the interior chamber and the exterior housing that receives a weight-enhancing material.

2. The enclosure of claim 1, further comprising a vent opening extending from the interior chamber through the exterior housing, wherein the vent opening enables heat generated by the heat-generating micro data center equipment to escape the interior chamber and the exterior housing.

3. The enclosure of claim 2, wherein the vent opening includes a coupling at the exterior housing.

4. The enclosure of claim 3, wherein the coupling comprises an attachment collar.

5. The enclosure of claim 1, wherein the material that is casualty-resistant and resistant to hostile environments comprises a mild steel.

6. The enclosure of claim 5, wherein the mild steel is coated with a thermal coating.

7. The enclosure of claim 6, wherein the interior chamber is welded to the exterior housing.

8. The enclosure of claim 1, further comprising a bullet-proof access panel that is removably secured to the interior chamber and further comprising a door that is hingedly secured to the exterior housing that is openable to reveal the bullet-proof access panel.

9. The enclosure of claim 1, wherein the exterior housing is of a circular configuration.

10. The enclosure of claim 9, wherein the interior chamber is of a square or rectangular configuration.

11. The enclosure of claim 1, wherein the exterior housing includes forklift tine openings enabling the enclosure to be lifted and lowered by a forklift.

12. The enclosure of claim 1, wherein the exterior housing includes one or more lifting attachments enabling the enclosure to be lifted and lowered by a load line of a crane.

13. The enclosure of claim 1, wherein the weight-enhancing material comprises a plain concrete.

14. The enclosure of claim 1, wherein the weight-enhancing material comprises a low density cellular concrete (LDCC).

15. The enclosure of claim 1, wherein the exterior housing includes a stacking feature that enables the enclosure to be stacked atop another enclosure.

16. The enclosure of claim 15, wherein the stacking feature includes an opening that enables the enclosure to be in electrical and/or data communication with the another enclosure.

17. The enclosure of claim 1, wherein the opening in the exterior housing directly interfaces with an air intake box that includes an air filter.

18. An enclosure for electronic equipment/electrical components, comprising:

- an exterior housing that includes an exterior shell having a first end and a second end, a bottom plate secured to the first end of the exterior shell, and a top plate secured to the second end of the exterior shell, wherein the exterior housing is comprised of a material that is both casualty-resistant and resistant to hostile environments;
- an interior chamber substantially surround by the exterior housing, wherein the interior chamber houses heat-generating electronic equipment/electrical components and wherein the interior chamber includes an airflow opening;
- an access panel removably secured to the interior chamber;
- a door hingedly coupled to the exterior housing that is openable to reveal the access panel;
- an air intake opening in at least one of the exterior shell and the top plate, wherein the air intake opening receives air from a location external to the exterior housing;
- an air intake pipe coupled between the air intake opening and the airflow opening that delivers the air received at the air intake opening to the interior chamber via the airflow opening;
- a vent opening extending from the interior chamber through the exterior housing, wherein the vent opening enables heat generated by the heat-generating electronic equipment/electrical components to escape the interior chamber and the exterior housing; and
- a void intermediate the exterior shell and the interior chamber that receives concrete.

19. A method of assembling the enclosure of claim 18, comprising:

- at a first location:
  - welding the bottom plate to the first end of the exterior shell;
  - welding the interior chamber to the exterior shell;

coupling the air intake pipe between the air intake opening and the airflow opening;

shipping the exterior shell welded to the bottom plate along with the top plate positioned atop second end of the exterior shell to a second location that is remote from the first location;

at the second location:

filling the void with concrete; and welding the top plate to the second end of the exterior shell.

20. The method of claim 19 further comprising:

at the first location: utilizing a stacking feature of the bottom plate of the enclosure to interface with a stacking feature of a top plate of another enclosure to stack the enclosure atop the another enclosure prior to shipping.

* * * * *